US008066095B1

(12) United States Patent
Bromer

(10) Patent No.: US 8,066,095 B1
(45) Date of Patent: Nov. 29, 2011

(54) TRANSVERSE WAVEGUIDE

(76) Inventor: Nicholas Sheppard Bromer, Marietta, PA (US)

( * ) Notice: Subject to any disclaimer, the term of this patent is extended or adjusted under 35 U.S.C. 154(b) by 0 days.

(21) Appl. No.: 12/924,181

(22) Filed: Sep. 22, 2010

Related U.S. Application Data

(60) Provisional application No. 61/277,376, filed on Sep. 24, 2009.

(51) Int. Cl.
*H05K 5/00* (2006.01)

(52) U.S. Cl. ........ 181/152; 181/148; 381/335; 381/338; 381/342

(58) Field of Classification Search .................. 181/152, 181/148; 381/335, 338, 342
See application file for complete search history.

(56) References Cited

U.S. PATENT DOCUMENTS

| | | | | |
|---|---|---|---|---|
| 2,979,149 | A * | 4/1961 | Carlsson | 181/147 |
| 3,978,941 | A * | 9/1976 | Siebert | 181/151 |
| 4,628,528 | A * | 12/1986 | Bose et al. | 381/335 |
| 4,924,962 | A * | 5/1990 | Terai et al. | 181/141 |
| 4,942,939 | A * | 7/1990 | Harrison | 181/156 |
| 5,187,333 | A * | 2/1993 | Adair | 181/152 |
| 5,737,435 | A * | 4/1998 | De Poortere et al. | 381/340 |
| 5,739,481 | A * | 4/1998 | Baumhauer et al. | 181/148 |
| 5,821,471 | A * | 10/1998 | McCuller | 181/156 |
| 6,278,789 | B1 * | 8/2001 | Potter | 381/338 |
| 6,411,718 | B1 * | 6/2002 | Danley et al. | 381/342 |
| 6,931,143 | B2 * | 8/2005 | Caron et al. | 381/337 |
| 7,461,718 | B2 * | 12/2008 | Dedieu et al. | 181/148 |
| 7,692,089 | B2 * | 4/2010 | Nishida | 84/644 |
| 7,743,878 | B1 * | 6/2010 | Moore | 181/152 |

* cited by examiner

*Primary Examiner* — Forrest M Phillips

(57) ABSTRACT

A compact bass speaker cabinet uses a long, narrow, tapered waveguide that acts as does a small radial portion of the air outside a large pulsating sphere, and has the same bass response as the large pulsating sphere. The smaller end is closed and the longer end is open. In one embodiment the inside of the waveguide is a rectangle about an inch thick and substantially as wide as the speaker or speakers that are mounted on the wider surface close to or slightly overlapping the closed end; and the inside surfaces are tapered so that they meet at a point which lies beyond the closed end by a distance equal to the radian wavelength of the longest sound wave that is to be produced.

18 Claims, 3 Drawing Sheets

TRANSVERSE WAVEGUIDE

CROSS-REFERENCE TO RELATED APPLICATION

This application claims the benefit of the provisional application entitled Sphere-Like Speaker Cabinet, Ser. No. 61/277,376, filed on Sep. 24, 2009 (the entire contents of which are entirely incorporated herein by reference).

BACKGROUND OF THE INVENTION

A source of sound and/or non-sound air motion (such as a loudspeaker) has been coupled to various hollow devices usually called horns or waveguides. These have been used to direct sound and also in attempts to generate low-frequency sound.

One type of waveguide associated with generation of low-frequency sound is the "exponential" horn or waveguide. The name refers to the cross-sectional area (the area of a plane taken across the length of the horn), which increases exponentially with distance from the small end. In such horns the speaker is mounted, usually coaxially, at the smaller end. An exponential horn has no zero or convergence point at which the diameter reaches zero (corresponding to the apex of a cone), and therefore the placement of the speaker cannot constitute any choice of distance from a zero point in an exponential horn.

Another known type of acoustic waveguide has a conical interior space, and this is an example of a waveguide or horn in which the cross-sectional area does not increase exponentially with distance from the small end, but instead increases as the square of the distance from the small end. Unlike an exponential horn, it has a point at which the area is zero, which is referred to as a zero point (for example, the sides of a cone meet at one point, the apex).

A conical horn represents a sector of a sphere. Other sectors of a sphere have the same area development: any closed curve on the surface of a sphere (for example, a rectangle) can define a tapering shape of a waveguide or horn by connecting all the points of the closed curve to the center point of the sphere by respective straight lines. A waveguide or horn in which the cross-sectional area increases as the square of the distance from a zero point will be referred to herein as a "radial" waveguide or horn. However, as discussed in the provisional application, such a radial waveguide or horn is not limited to shapes with straight lines between the zero point and the open end, as long as the cross-sectional area develops substantially as the square of the distance from the zero point (center or convergence point when the waveguide is a projection of straight lines from one point).

Conical waveguides have been used with loudspeakers and other diaphragms. Some early mechanical record players used a mechanically-driven diaphragm (driver) coupled to a conical horn, with the axes of the horn and the driver aligned. Often a flared bell was placed at the end of the horn. The same basic design is still used in some modern public-address equipment, although exponential horns are more common.

U.S. Pat. No. 2,979,149 to Carlsson discloses a conical waveguide with "loudspeaker mechanisms" 5-9 (which may or may not be loudspeakers; they are drawn to resemble wire mesh) mounted at the smaller end and also on a plate 24 that "closes" the larger end of the cone. The loudspeaker mechanism 3' that is mounted in the plate 24 "is mainly used for low frequencies" while the higher frequencies are produced by a smaller loudspeaker mechanism 5 located at the smaller end (col. 3, lines 54-61). Carlsson teaches generating bass sound with a loudspeaker located at the larger end of a conical waveguide, which is contrary to the invention set out below.

U.S. Pat. No. 4,628,528 shows in FIG. 2 a loudspeaker mounted at one end of a "hard tube 33" (col. 3, line 45) with the axes of the loudspeaker and the tube aligned. This arrangement is said to function as "an acoustic transmission line of length l." The patent discusses this arrangement according to the conventional theory of organ pipes and the like, which is based on the idea that sound waves reflect from the open end and create a resonance. This theory, which the applicants think is incorrect (because the speed of sound is essentially the same inside and outside of a tube, and therefore there is not actually any impedance mismatch at the open end), fails to take note of the non-resonant effects of a tube on a speaker. FIG. 1 of U.S. Pat. No. 6,278,789 shows a loudspeaker mounted coaxially in a tube, with damping material 14 "near" the driver 11; this patent teaches that damping material at the open end reduces bass output (col. 1, line 60). FIG. 1 of U.S. Pat. No. 3,978,941, likewise, shows a loudspeaker coaxially mounted in a tube, but here the damping material lines the sides of the tube.

A conical waveguide coupled with a coaxial driver is used in the Peavey Quadratic-Throat Waveguide. A white paper on the Peavey Quadratic-Throat Waveguide (http://aa.peavey.com) states, "The weakness of conical horns lies in their acoustical loading characteristics for the transducer, which is insufficient at the low-frequency end." (Contrary to this teaching, the inventors have demonstrated that a conical horn can exhibit high acoustical loading at bass frequencies.) The Quadratic-Throat Waveguide places the apex of the cone at the surface of the driver (loudspeaker element), which inhibits its bass response for reasons discussed below.

The Yorkville company's Unity speaker cabinets use a wide-angle conical horn with speakers mounted on the side of the cone adjacent to the cone's apex. Yorkville describes it as "Summation Aperture Horn Technology, which was invented by loudspeaker designer Tom Danley" (quoting http://www.yorkville.com/products.asp?type=29&cat=38 which cites U.S. Pat. No. 6,411,718 B1). The design uses an axial high frequency compression driver and three midrange drivers all mounted on the side of a single 60°×60° conical horn. The company claims frequencies from 300 Hz to 20 kHz for the horn, and provides a 15-inch subwoofer in the same cabinet as the horn, which demonstrates that the horn does not produce adequate bass.

The Yorkville websites quotes "patent holder Tom Danley" as stating, "with a conical horn, . . . the expansion rate acts as a high pass filter, the low frequency energy does not couple to the mouth. Move a few inches toward the mouth and one finds the expansion rate is much slower and suitable for low midrange, if only that was where the driver was. All one has to do is obtain a mid driver, suitable for efficient horn loading in that frequency band and find the point in the flare where the expansion rate is suitable for that frequency range and couple the sound in at that point. Because the compression driver and each mid driver are less than ¼ wavelength apart, their output combines fully and coherently, something which cannot happen if the driver were further than about ⅓ wavelength apart."

Thus, the prior art recognizes that mounting a speaker farther from the apex of a cone increases the bass response. However, the prior artisans have not utilized this observation to produce bass, because of what is believed to be a misguided theory. According to the website, "The Unity™ technology takes advantage of the variable flare rate nature of a conical horn. By sectioning the horn according to the expansion rate, the horn can be divided into frequency bands and be loaded with suitable drivers mounted outside the acoustic path." The applicants base their own design on a completely different theory, and have achieved much better results in producing sound waves that are long in comparison to the size of a horn.

Yorkville's placement of the larger drivers close to the apex, and the failure to truncate the cone immediately below the larger drivers, are inefficient in generating bass, for the reasons set out below. Like the Peavey design, the Yorkville design apparently includes space in the apex of the cone beyond the midrange speakers, which increases the length of the waveguide and also decreases the bass radiating efficiency.

The problem with existing combinations of radial horns and drivers is that their designs do not mimic the action of a large spherical or plane radiator, which are the known models for efficient radiation of bass sound, and therefore cannot generate bass sound efficiently. There has been a need for more efficient production of bass sound.

SUMMARY OF THE INVENTION

Unlike the existing devices mentioned above, in this invention a driver is placed at or closely adjacent to the closed end of a truncated radial waveguide (the other end being open), and the waveguide is shaped such that the closed end is at least a certain distance from the zero point, apex, or center of the waveguide, the distance being related to the longest wavelength of sound that is desired to be produced. These features allow bass to be generated inside the waveguide, because the waveguide then mimics a portion of the surface of a large, pulsating sphere and a portion of the air surrounding it. (The invention can also work in other fluids, such as water.) More specifically, the distance from the closed end to the convergence point or apex may be greater than the radian wavelength of the lowest-frequency sound that is to be generated. (The radian wavelength is the wavelength divided by $2\pi$) As described below, the invention has been reduced to practice with distances from the closed end to the convergence point (denoted as R below) ranging from 15 inches to infinity (specific R values of 15, 21, 29, 30, 60, and 70 inches, and of 13, 18, and infinity feet have been realized in practice; other values are within the scope of invention).

For convenience of construction and to minimize the total volume, the waveguide can be made rectangular with a loudspeaker mounted on the side of the waveguide. For greatest compactness, the speaker can be mounted on a wider side of the waveguide and the thickness of the waveguide can be reduced to about one inch, or, thinner than the diameter of the speaker (or speakers) mounted on the side. Also, the length of the waveguide can be greater than the diameter of the speaker (or, greater than the speaker width parallel to the length of the waveguide). When the speaker is mounted on the side of the waveguide, so that the axes of the waveguide and speaker are substantially perpendicular, this is referred to herein as a "transverse waveguide.

Air motion caused by the transversely-mounted speaker should acoustically mimic the air motion that would be caused by waveguide-axial vibrations of the plate closing the smaller end (which would directly mimic the pulsating sphere mentioned elsewhere). The reason is that the region of pressurized air created by the transverse speaker at the interior end of the transverse waveguide is much smaller than a bass wavelength. As long as the wavelength is greater than the speaker diameter, it should not matter whether it is the transverse speaker cone or the closed waveguide end plate that is vibrating.

Because the sound waves travel in the axial direction of the waveguide, wave formation will is expected to decrease when the sound waves are short enough to be comparable to the speaker diameter. Therefore, for the transverse waveguide to create higher frequencies with more efficiency, the speaker can be made narrower along the axial direction of the waveguide. Also, a row of small speakers can be placed along the inner end, so that the distance from the closed end to the forward edge of the speaker is no more than the diameter of one speaker, while the width (transverse to the waveguide axis) can be larger so that a greater volume of air is moved. In addition, the rearmost edge of the speaker can be made to overlap the closed end.

Since the time of filing the provisional application 61/277,376, experiments have been conducted with transverse waveguides of various lengths and new applications of the waveguide, in particular a waveguide in combination with a musical instrument case and with a musical instrument, have been invented. The combination of an instrument case with a transverse waveguide and loudspeaker was reduced to practice (transverse waveguide attached to a Gator brand bass guitar case and speaker mounted inside) on Sunday, Mar. 21, 2010, and was wired to a jack and played on Monday, Mar. 22, 2010. Nick Bromer had conceived of the combination several weeks before that.

The '376 application guessed that the waveguide length L should be a certain fraction of the lowest intended sound wavelength, but this has not been experimentally verified. A 60-inch long transverse waveguide with a 6.5-inch speaker was built, its response was tested, and then it was sawed in half, tested again, and this repeated once more, so that lengths of 60, 30, and 15 inches were tested (along with an intermediate length of 21 inches). In each case the response curve was, in general, flat down to a "knee" and thence descended in a line that was, basically, an inclined straight line on a semi-log graph of length plotted against decibels. The position of the knee moved upward, from approximately 55 Hz for the 60-inch waveguide to approximately 63 Hz for the 30-inch waveguide and approximately 80 Hz for the 15-inch waveguide. The position of the knee was not halved by doubling the length, as expected. The positions of the "knees" were plotted on semi-log paper (length on the logarithmic scale, frequency on the linear scale) and these points fell pretty well on a straight line, indicating that doubling the length would not divide the knee frequency by some factor, but rather would decrease the position of the knee by some number of hertz. The transverse waveguide did not appear (in this test) to respond as if it were a sound source having a diameter equal to or proportional to the length of the waveguide.

It was noted during this experiment that even a slight bending of the 60-inch-long waveguide would inhibit the formation of sound, at least at certain frequencies.

Since the time of filing the application Ser. No. 61/277,376, a number of transverse waveguides (with the speaker facing transverse to the length or axis of the waveguide) have been built with tapers more narrow than that described in the '376 application. That is, the radius R of the virtual sphere corresponding to the waveguide was greater than the 19 inches mentioned in the example of the '376 application.

On Dec. 5, 2009, Nick Bromer built and used a transverse waveguide with parallel sides, corresponding to a sphere of radius R equal to infinity. An experiment with a 6.5-inch speaker rigged to sit sideways in and to move through a PVC sewer pipe, including measuring the response at a bass frequency for various lengths of pipe between the speaker and the open end, did not seem to show a bass response increasing monotonically with the length of pipe. Based on this experiment (which may have been flawed), the currently preferred waveguide is straight and tapered at a narrow angle so that the distance R from the closed end to the center of the virtual sphere is about twelve feet.

The very first transverse waveguide Nick Bromer built, which was described and illustrated in the provisional '376 Application, was privately demonstrated at the 2009 birthday party of his niece, Sarah Galvin (L=29 inches, R=19 inches). The next was a 15-inch-long version built for a 3.5-inch speaker, which was demonstrated at AES convention held on October 9-12 in New York City, and which is also demonstrated in the beginning of the YouTube video mentioned in the next paragraph (L=15 inches, R=19 inches). The third was a 24-inch version made from the first, with two opposing speakers, cut down to 1 inch thick at narrow end, reduced to practice on Oct. 24 or 25, 2009, and played in public at Shank's tavern in Marietta, Pa., on Oct. 29, 2009 (L=24 inches, R=19 inches). A fourth, which is also demonstrated in the YouTube video, used a single ten-inch speaker (L=29 inches, R=70 inches). Still another used an eight-inch, B&C brand 8NDL51 speaker (L=29 inches, R=about 13 feet). The transverse waveguide cabinet now being sold at www.bromersound.com uses a 150-watt (RMS) Eminence speaker (L=29 inches, R=about 18 feet).

Since filing the '376 Application, structures to enclose the back end of the speaker have been incorporated to reduce a buffeting that was noted and to reduce noise and out-of-phase sound from the back side of the speaker cone. The 24-inch, two-speaker version was the first, using two stainless steel salad bowls to cover the backs of the speakers. In latter versions, the back of the speaker cone was enclosed in a cabinet built onto the side of the transverse waveguide. The YouTube video (http://www.youtube.com/watch?v=YSaIkG_wGoQ) shows such a cabinet. A portion of the speaker's magnet structure protrudes through the side of this cabinet to allow the speaker to dissipate heat.

The invention includes the combination of a loudspeaker, waveguide, and cabinet where the cabinet includes a conventional resonance port. Adding a resonance port would limit the pressure inside the cabinet due to the motion of the rear of the speaker cone, and also would tend to limit the speaker cone excursion, which can damage the speaker if allowed to become too great. The resonance port can also augment the bass response at certain frequencies.

It has been found that when the back of the speaker protrudes from the side of the cabinet opposite to the waveguide, speakers with ventilation holes in the rear can create noise as the speaker is driven at high amplitude, due to air rushing in and out of the ventilation holes. To lessen such noise, a preferably vertical channel over the vent holes, perhaps lined with foam or other sound-absorbing material, can be used to dampen the air sound.

BRIEF DESCRIPTION OF THE DRAWING FIGURES

DETAILED DESCRIPTION OF THE PREFERRED EMBODIMENTS

Figure 1A:
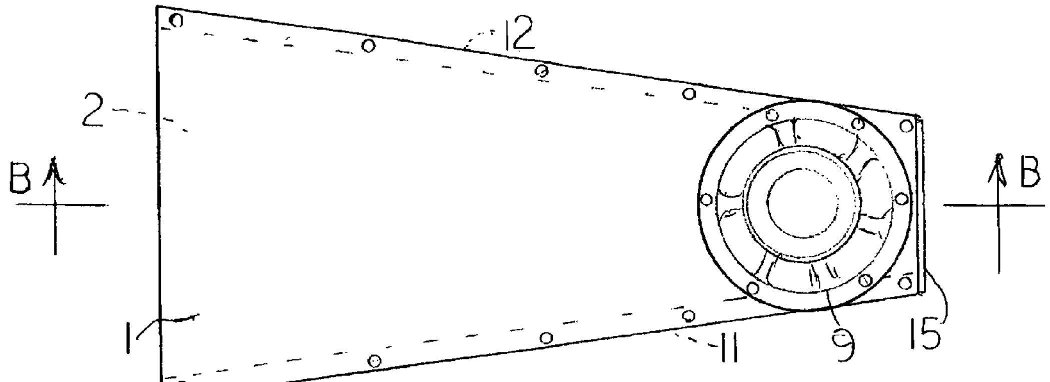
FIG. 1A is a plan view of a realized prototype, on a scale of one inch equals one pica.
Figure 1B:
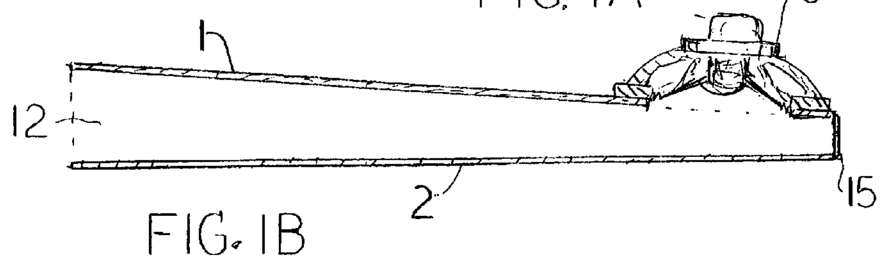
FIG. 1B is a cross-sectional view of the bass-speaker cabinet of FIG. 1A taken on B-B.

FIGS. 1A and 1B show an example of the invention. The exemplary illustrated cabinet comprises five pieces of wood: an upper plate 1 of, e.g., quarter-inch-thick "Baltic birch" plywood; a similar lower plate 2 that is congruent to the upper plate 1; a left-side piece of, e.g., ¾-inch thick pine board, 11, located between the plates 1 and 2 and immediately adjacent to side edges of the plates; a similar right-side board 12 that is congruent to the board 11 and is similarly placed on the other side of the cabinet; and an end plate 15. All of these optionally wooden parts can be fastened together with glue and/or screws. In the upper plate 1, but not in the lower plate 2, is an un-numbered generally round hole to accommodate a loudspeaker 9, which is placed and fastened over the hole. The loudspeaker axis is transverse to the widest dimensions of the waveguide, which is the reason for the name "transverse waveguide." This configuration greatly reduces the size. Recently, woofers have come on the market that are very thin (for example, the Dayton NS210-44, available from Parts Express, an 8-inch, high-wattage speaker which is only 2.5 inches thick). The use of such a speaker makes it possible to create a bass cabinet or subwoofer that is only about three inches thick, which a substantial advance over the prior art.

When such a transverse waveguide is 29 inches long and the taper of the waveguide is such that the interior surfaces all intersect at a distance of 10.3 feet from the closed end, the bass response is measured to be just as good as a commercial bass rig (Hartke A100) and is also acceptable to professional musicians; one described the bass response as "better than an 18-inch sub[woofer]" and another described it as "great." Another transverse waveguide cabinet, just 15 inches long, also had a response into the low bass regions.

Figure 2:
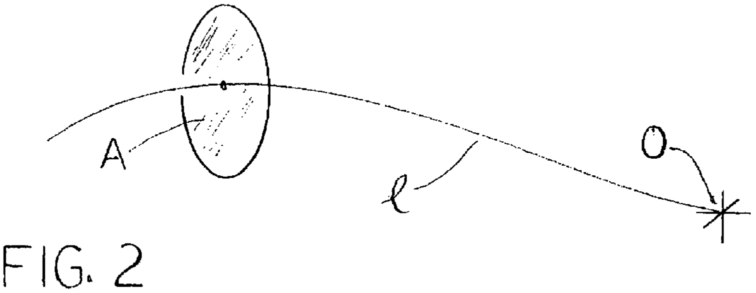
FIG. 2 is a perspective schematic geometrical view showing the basis of the formula.

The transverse waveguide can be generalized, as shown in FIG. 2, by the relationship $$A=kr^x,$$

where r is the distance along the line l from the origin O to the point; x is an exponent; A is the area inside the enclosing surface, measured on a surface that is perpendicular to the line at the point where the line crosses the surface; and k is a constant of proportionality. In the example of a frustrum of a cone, r is distance along a line from the center of the pulsating sphere, x equals 2, A is a measure of the area perpendicular to the line of r (which may be straight or curved), and parameter k is small for a narrow-angle cone and large for a broad cone. The formula also covers a pyramidal waveguide with parallel sides that meet at a single point. The parent provisional application included a discussion of the ways in which the shape of the waveguide might be generalized, which are incorporated by reference.

The transverse waveguides such as that shown in FIGS. 1-2 include a diverging rectangular cross section, with the loudspeaker being mounted on a width side of a waveguide, the waveguide being substantially thinner than the loudspeaker diameter and substantially longer than the loudspeaker diameter in an axial length direction of the waveguide, the waveguide including a closed end and a substantially open end located opposite to the closed end, the loudspeaker being mounted on a wider side of the waveguide closely adjacent to the closed end. Also, in these the loudspeaker has an axis and the axis is oriented transverse to the axial length of the waveguide. However, the invention is not limited to this configuration.

The invention includes the "bare" transverse waveguide and loudspeaker combination shown in the drawing of the provisional '376 Application, and also that combination with a cabinet enclosing the back of the speaker, such as in the YouTube video referenced above. It further includes the cabinet being structured and openable so as to accept and hold a musical instrument, and to constitute an instrument case.

The best mode now conceived (for bass guitar players, not sound people only needing a compact subwoofer) is a combination of the waveguide, loudspeaker, and cabinet where the cabinet is adapted to hold a musical instrument, shown in FIGS. 3-5 and described below. The illustrated example is intended for bass guitar, and provides a one-piece item that contains the guitar, the speaker cabinet, and the amplifier, as well as space for cords, straps, etc., such that a musician can carry just the one item to a gig. This embodiment can also be used for other instruments.

Figure 3:
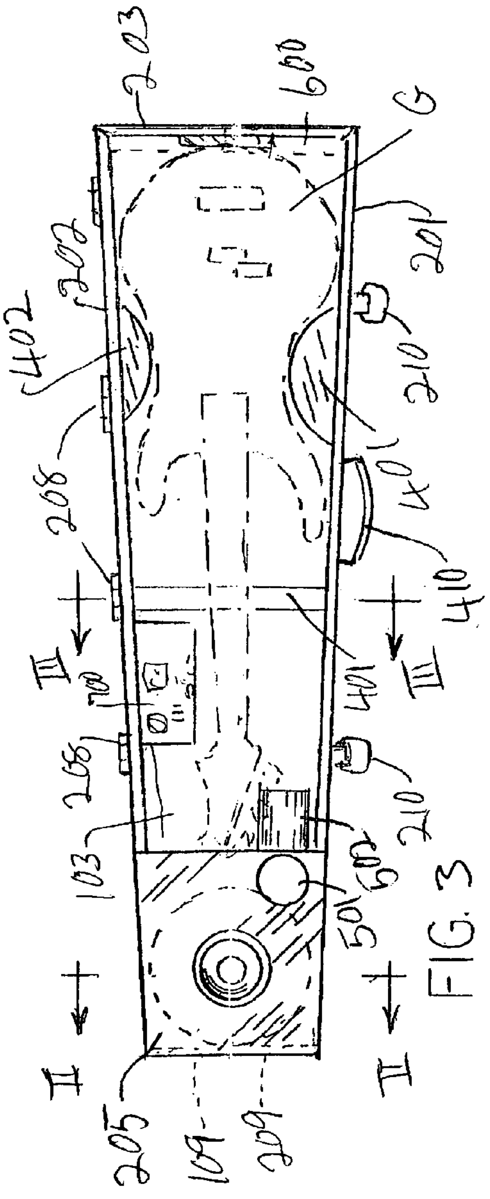
FIG. 3 is a plan view of the best mode contemplated.
Figure 4:
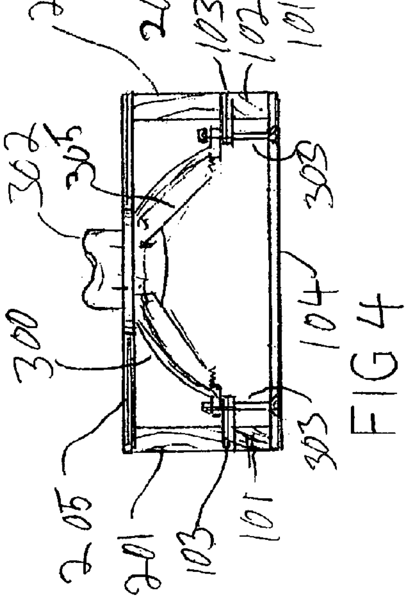
FIG. 4 is a cross-sectional view of FIG. 1 taken on II-II.
Figure 5:
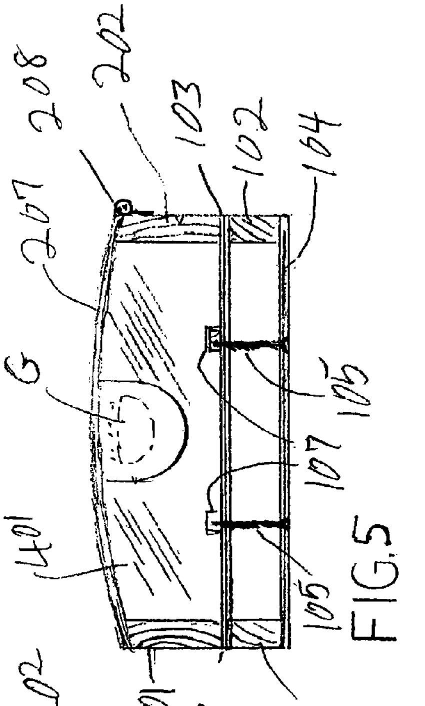
FIG. 5 is a cross-sectional view of FIG. 1 taken on III-III.

Referring to FIGS. 3-5, the transverse waveguide 100 is constructed of two tapered edge pieces 101, 102, which might be ordinary pine wood, sandwiched by two sheets of plywood 103, 104, made of for example 6-mm (quarter inch) birch plywood, which are tapered in the transverse direction (as seen in FIG. 3). Other conventional materials, such as fiberglass/resin, metal-skin foam sandwich, fiberboard such as MDF, sheet metal, formed curved plywood, and so on, can all be used. To stabilize these two exemplary plywood panels against resonant vibration caused by pulsations of air pressure between them, the two panels can optionally be additionally connected by through-screws 105 which will act as stiffening members to reduce vibration of the plywood panels, and also to stiffen the overall structure against bending and twisting by maintaining a more constant distance between the two panels 103, 104 (as in foam-core and other stressed-skin materials). Ordinary deck screws are suitable. There can be one, two, or more rows of such screws 105, or the screws 105 can be placed in other patterns, or omitted. Placing the screws 105 in rows is convenient because this allows strips of wood 107 on the upper side to prevent the sharp screw ends from protruding into the case above. Besides screws, any thin members between the interior surfaces of the waveguide, if attached to the panels at either surface, will perform the same function of stiffening the waveguide while avoiding resistance to axial motion of air inside the waveguide (motion to the left and right in FIG. 3, and in and out of the paper in FIGS. 4 and 5). The waveguide is closed at the smaller end by an end plate 109.

Except for the open end and the speaker-mounting hole (visible as a gap in panel 103 in cross-sectional FIG. 4), the waveguide 100 is preferably sealed.

The exemplary instrument case comprises the waveguide 100 as a bottom for a cabinet 200 that also holds the guitar G (or other instrument), shown by dashed lines. Four side and end pieces 201, 202, 203, 209 may be of wood fastened to the upper side of the waveguide and also to each other at the four corners, for example by screws and/or glue. The cabinet 200 also comprises two upper panels: a fixed panel 205, which might be removably fixed to the end piece 209 and to portions of the two side pieces 201, 202; and a door 207. The door 207 is not illustrated in FIG. 3 for the sake of clarity, but the hinges 208 which attach the door 207 to the side piece 202 are shown in FIG. 3.

The door is seen in FIG. 5. The exemplary door 207 is made of a sheet of 6-mm plywood, like the exemplary panels 103, 104, and 205. To reduce the chances of vibration, the door 207 is, when closed as shown in FIG. 5, bent into a slight curve by a guitar neck rest 401, and optionally other members such as end piece 203. The edge opposite to the hinges 208 may be held down by clasps 210, as is common in hard-shell instrument cases, or by other things.

When the cabinet 200 is closed by the door 207, the waveguide 100 remains open at the larger end (the end on the right in FIG. 3), so that when looking at the unit from the right side in FIG. 3, the opening of the waveguide is seen below the side piece 203. When looking at the unit from the left side in FIG. 3, no opening is seen because the end pieces 109 and 209 block the waveguide 100 and cabinet 200, respectively.

The bass guitar G can be contained in the space created by the waveguide and cushioned by suitable rests, cradles, pads, and so on that position the instrument and protect it from damage caused by shocks and impacts. FIG. 3 shows blocks 401, 402 and a neck rest 401 (also seen in FIG. 5).

In the illustrated example, the panel 205 is shown as flat but can be curved if desired, or curved to match the curve of the closed door 207. The panel may be removable to allow a loudspeaker 300 to be replaced (the speaker 300 is discussed below).

As discussed above, the interior of the waveguide 200 is shaped as a radial section or sector extending from the surface of a large sphere. The loudspeaker 300 mimics the acoustic action of such a sphere when radially pulsating. Because air is fluid, the action of the moving cone 205 of the speaker (which is up-and-down in FIG. 4) essentially mimics a hypothetical motion of the end plate 109 in the axial direction of the waveguide (left-right in FIG. 3, in-and-out of the paper in FIGS. 4 and 5), that would exactly mimic a sector of the pulsating sphere. By placing the speaker 300 as shown, the transverse waveguide achieves maximum compactness.

The bass response of the transverse waveguide, as predicted from the established theoretical response of a pulsating sphere and as measured by experiments, increases with an increased length L for a fixed radius R. The exemplary interior dimensions of the illustrated waveguide are: approximately 57 inches in length (L) as would be measured by a yardstick inserted into the open so as to be stopped by the end plate 109 (the entire item is slightly longer, due to the end plate 109 having a thickness; tapering in width from about 9 inches at the smaller closed end to about 15 inches at the open end; and tapering in thickness from about one inch at the closed end to about 15/9 inch at the open end. (The drawing is to scale, with FIGS. 4 and 5 shown twice as large as FIG. 3.)

With these dimensions the interior planes of the waveguide converge to a single point (zero point) at a Distance® that is 7 and ⅛ feet past the closed end, and therefore the bass response can approach that of a pulsating sphere 7 and ⅛ feet in radius. Such a sphere has a theoretical bass response that is 3 dB down at about 30 Hz, which is the frequency of the low B on a five-string electric bass. Although the length L (here, 57 inches) will also affect the bass frequency response, the response will not be greatly limited by the value of R. The width at the closed end is suitable for mounting, e.g., an 8-inch or a 10-inch loudspeaker, because a 10-inch loudspeaker has a hole cutout diameter of about 9 inches. The exemplary outside width dimensions are 10.5 inches at the closed end and 16.5 inches at the open end, if ¾-inch finished wood is used for the sides of the waveguide. These dimensions are exemplary.

The speaker 300 is held in place over the cutout in the panel 103 by screws 303, but any structure for locating the speaker 300 can be used. The rear portion 302 of the speaker 300 protrudes through a suitable opening in the panel 205, which allows the cabinet side and end pieces 201, 202, 203, 209 to be narrower, and also allows the speaker 300 to dissipate heat. Most electric guitars are less than three inches thick overall.

The back of the speaker cone 305 is in communication with the inside of the cabinet 200; that is, the volume under the panel 205 is not sealed off from the volume under the door 207, so that the loudspeaker 300 shares one interior space with the guitar G. (Baffles, etc., can be used to adjust the closed air volume in which the speaker 300 is contained, if desired.) The headstock of the instrument may be located close by the speaker 300, either above the headstock as shown in FIG. 1 or else beside the headstock (not shown), so as to reduce the overall length if that is desired. In the illustrated design, the waveguide 100 and the cabinet 200 are congruent in outline, as seen in FIG. 3; in the mentioned alternate design, where the speaker is beside the headstock, they will not be congruent. The speaker spans an opening (not numbered, visible in FIG. 4) through the side of the waveguide into the closed end of the waveguide.

In one embodiment (not shown) the edge of the speaker frame is not on the outside surface of the waveguide, but instead a portion of the frame is within the speaker cutout hole, with the speaker supported in its axial direction by the far panel (standoffs or similar hardware can be used) and the gap between the speaker frame and the cutout hole filled with putty or otherwise sealed against air leakage, if necessary. By mounting the speaker in this way, the interior surface of the waveguide is less indented by the speaker and is more like a plane surface, which is the model on which the transverse waveguide is based.

When the cover 207 is closed and the case is substantially or sufficiently airtight (meaning, for example, that there is no distracting noise caused by air hissing into and out of the case, and no interference with the acoustics), then there can be large forces on the interior of the cover due to air pressure variations, especially if the case is sealed rather than vented. To prevent vibration, the cover should be properly designed. This can be accomplished by one or more of the following methods. First, the cover might be made stiff, for example by using a stressed-skin structure or material. Second, the cover can be slightly curved (as illustrated). Third, the cover can be damped. Ordinary weather-sealing strips, such as Frost King Rubber Foam Weatherseal, can be used for sealing and damping.

A handle 410 may be provided, or shoulder straps (not shown), for carrying.

It is also possible to build a case in which the instrument slides into an opened end, moving parallel to the length of the waveguide (not shown), which might allow the cover to be more resistant to vibrations. At present, this would be the preferred mode for a violin.

The stiffness and damping requirements for the cover can possibly be lessened by using a cabinet (here the instrument-containing space) that is vented. Vents (ports) are used in many bass speaker cabinets, usually tuned with the contained air to a low note of resonance. This arrangement not only prevents high pressures inside by allowing air to leave, but it also reduces speaker excursion at the low frequency to which the cabinet/port is tuned, because the speaker cone moves very little at the resonance frequency.

Limiting the excursion is useful in the transverse waveguide. The bass response is not limited by the speaker diameter, and therefore small speakers (6.5 inch, 8 inch, or 10 inch diameter, for example) are more suitable due to their compactness and lower cost. However, smaller speakers tend to have lower maximum cone excursion than larger ones and are more in need of excursion-limiting.

The illustrated embodiment includes an optional resonance port 501 coupled to a resonance tube 502. The illustrated example has the port 501 located in the fixed panel 205 next to the speaker, and the resonance tube 502 to which it is connected extends in the direction that is aligned with the axis of the waveguide. The resonance tube might optionally include the movable cover as one side.

The illustrated waveguide 100 is approximately one inch thick. A waveguide cannot be too thin, or the speaker cone will hit the other side. It should not be too thick, because that will increase the thickness and weight of the item as a whole. An advantage of a thinner waveguide is that the opening is narrow, which causes emerging sound to diffract over a wide angle. A transverse waveguide intended for general or PA use, in which the frequencies of interest can be very short, might have a thinner waveguide so as to diffract the shorter-frequency sound over a wider area. For treble applications, the opening can be as narrow as one inch, one half inch, one quarter inch, one eighth inch, or one sixteenth inch. For other applications, for example waveguides built for combination with very long-throw woofers, the opening can be as wide as (alternatively) 1.0, 1.5, 2.0, 2.5, 3.0, 3.5, 4.0, 4.5, 5.0, 5.5, . . . inches. The width of the open end can also be as little as (alternatively) 0.75, 0.50, or 0.25 inch. The relationship between the width of the opening and the volume of produced sound has not been investigated. It may be that very narrow waveguides will reduce the sound volume or otherwise degrade the sound.

The provisional '376 application mentioned placing material resistant to air motion at or across the open end of the waveguide, to reduce air velocity at the opening. Reduction of air velocity cuts down resonance much more strongly than sound, because resonances are generated by air rushing in and out, while sound involves only a small air motion. The force of a resistance is proportional to the air velocity through a resistant material, so that resonances, which have large velocity, will be reduced in greater proportion as compared to sounds. Therefore the air-velocity-resistant material will lightly damp the sound and do so evenly at all frequencies, but the resonances that are caused by large flows of air will be strongly damped.

In the bass transverse waveguides built so far, resonances do not seem to be a problem. However, for more-treble units, such as ones designed for PA use or for treble instruments such as voice, violin, guitar, etc., a damper at the opening might be a preferred design. Such a damper might include open cell foam, batting, or other material resistant to air velocity, filled in the opening for a short distance, or, such a material or a roughness lining the side surfaces around the open end of the waveguide, or, material such as aluminum honeycomb with many narrow passages. Any material or structure that resists a flow of air can be used to reduce resonances.

FIG. 3 shows an optional plug of wind-resistant material 600, for example open-cell foam, mounted in the open end of the transverse waveguide.

In the following claims, "substantially equal to 2" means in a range of 1.9-2.1; or, alternatively, in a range of 1.8-2.2; or, alternatively, in a range of 1.7-2.3; or, alternatively, in a range of 1.6-2.4; or, alternatively, in a range of 1.5-2.5; or, alternatively, in a range of 1.4-2.6; or, alternatively, in a range of 1.3-2.7; or, alternatively, in a range of 1.2-2.8; or, alternatively, in a range of 1.3-2.7; or, alternatively, in a range of 1.2-2.8; or, alternatively, in a range of 1.1-2.9.

Another invention related to producing bass sound, which was conceived in mid-2009 but which has not yet been fully reduced to practice, is based on a light-weight, mechanically damped acoustic resistor element. When such an element is subjected to pressure pulsations, it will be pushed back and forth by the pressure while at the same time passing a certain amount of sound through the acoustic resistance. This should result in bass sound from a very small-diameter element.

Figure 6:
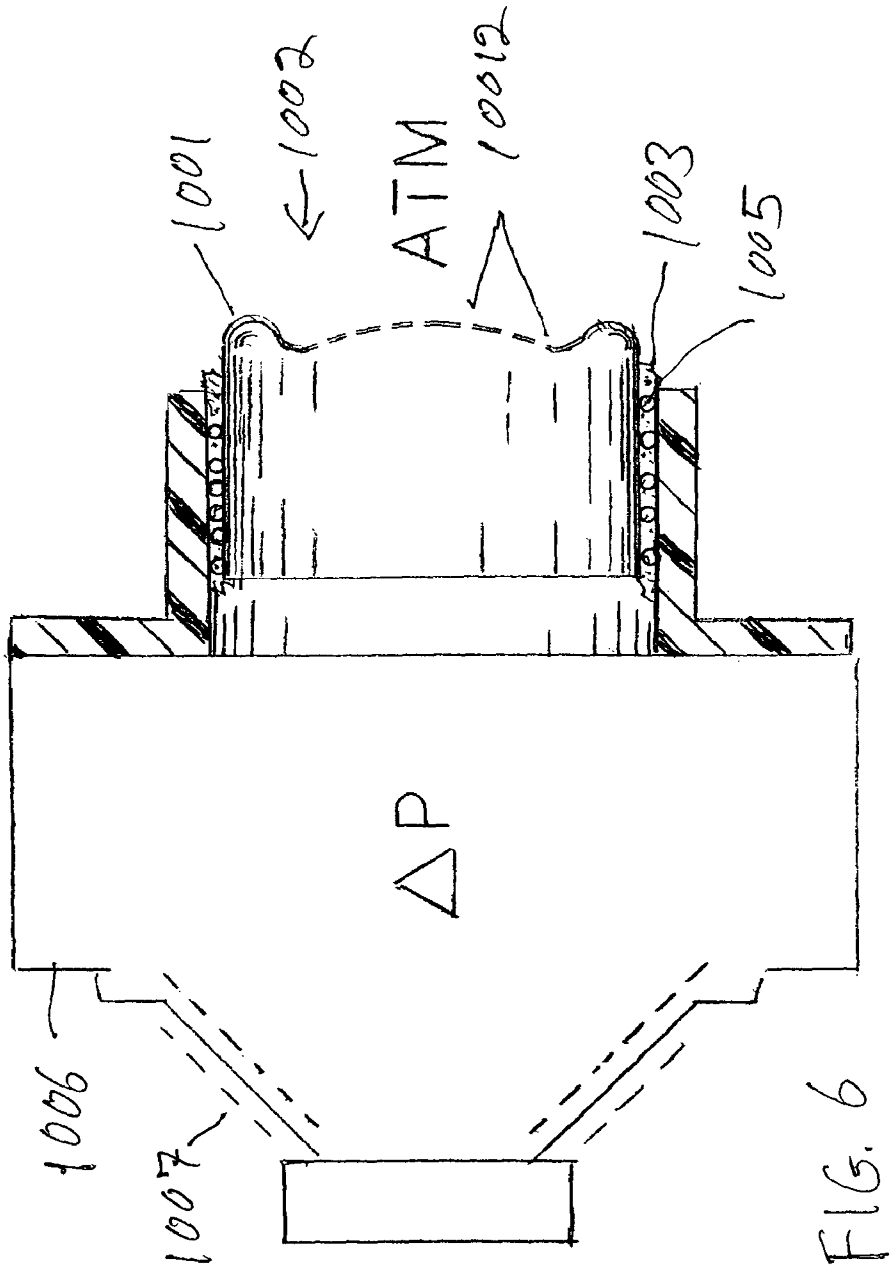
FIG. 6 is a cross-sectional, partially schematic view of a beer-can subwoofer.

One possible example of this is shown in FIG. 6, which is a schematic view on the left side and an axial cross section on the right side. The bottom portion of an aluminum beer can 1001 is arranged to slide axially in a cylindrical hole 1002; both of the beer can 1001 and the hole 1002 are concentric, and the view is as if the device had be sawn in half, with axis lying in the cut.

The sliding motion of the beer can 1001 in the hole 1002 is resisted by a damper such as a dashpot, electromagnetic damper, etc. In the example of FIG. 6, damping is provided by a viscous grease 1003 between the outer cylindrical surface of the beer can 1001 and the cylindrical hole 1002 in which it slides. Small balls 1005 are shown mixed with the grease 1003, to act as ball bearings and maintain a constant thickness of grease 1003.

The baffle which includes the hole 1002 is part of a closed box 1006 in which is mounted a loudspeaker 1007, shown schematically. When the loudspeaker is driven with a sinusoidal signal, its cone will move (indicated by dash lines on either side of the cone) and will create pressure pulsations inside the box, which are labeled as $\Delta P$.

Beer cans are made of aluminum, which has a high strength-to-weight ratio; their shape also provides great stiffness in the axial direction. The beer can bottom portion is thus not very massive, but it can resist force. The sound pressure pulsations $\Delta P$ will drive it axially forward and backward. The beer can 1001 is not attached to a spring (except perhaps a weak spring, only strong enough to prevent it from drifting out of position) and therefore it is not an harmonic oscillator. Instead, the motion of the beer can 1001 is described by $F=ma+kv$, where F is the force applied by the inside air, m is the mass of the beer can, a is the axial acceleration of the beer can, v is the axial velocity of the beer can, and k is a coefficient of friction or damping, due to the viscous grease 1003, or other damper.

F is proportional to the inside air pressure. If the air pressure pulsation $\Delta P$ is sinusoidal, and the mass of the beer can is negligible (so that ma can be ignored) then the beer can's velocity will be in phase with the air pressure. The air just inside the bottom of the beer can 1001 will have the characteristics of a sound, namely, that the pressure and the particle velocity are in phase. More specifically, the air just behind the beer can bottom will have the characteristic of an outwardly-moving sound wave, because, when the pressure is high inside the box, the beer can will be moving outwardly, and when the pressure is low inside the box, the beer can will be sucked inwardly.

Thus, there should be a very loud sound next to the interior of the beer can. In order to release some of this sound, holes 10012 are made in the bottom of the beer can 1001. These holes 10012 will allow some passage of both air, and sound. Thus, sound will be radiated through the holes in the air, labeled as "ATM" (atmosphere) in FIG. 6.

It is noteworthy that the mechanism for producing sound discussed above is completely independent of sound frequency, because the passage of sound through a barrier, such as the plural holes 10012, is not strongly determined by frequency. The mechanism of FIG. 6 should produce sound regardless of frequency, and therefore should produce a strong bass. This invention is believed to be the first in which a bass sound radiator does not need to be of a size comparable to the radian wavelength of the bass sound, in at least one dimension, in order to radiate effectively.

Returning to the formula above, if kv is effectively zero (e.g., the beer can is sliding on Teflon), such that ma is substantially greater than kv, then the axial velocity of the beer can will not be in phase with the pressure, because the acceleration of a body is ninety degrees out of phase with a sinusoidal force. As a result, there will be no sound on the interior side of the beer can, and therefore no sound will emerge even if the bottom of the beer can is made partially transparent to sound. Therefore low mass is important.

There is expected to be an optimum amount of air/sound leakage at which the produced sound will be the loudest. If the acoustic resistance is made too low (e.g., through-holes too big), then the pressure will escape without moving the beer can against the mechanical damping, and little sound will be created on the inside, so that little will emerge; if the acoustic resistance is made too great (e.g., through-holes too small), then sound will be created inside but little will escape. Produced sound levels are expected to be maximized with a certain amount of sound leakage, e.g., a certain size of the holes.

Although a beer can bottom is readily available and has the desired low mass, other cylindrical or non-cylindrical elements can be used. As noted above, size matters not. The acoustic resistance can be provided by holes as described above, by materials such as open-cell foam, or by any other material that passes sound while resisting the motion of air through the material.

I claim:

1. In combination: a waveguide and at least one loudspeaker mounted on the waveguide; the waveguide having at least one wall and including an interior surrounding an interior space having a cross sectional area described by the formula $A=kr^x$, Where r is the distance along a line form a zero point where r=0, x is an exponent substantially equal to 2, A is the cross sectional area inside the waveguide measured on a surface that is perpendicular to the line at the point wherein the line crosses the surface, and k is a constant of proportionality;

wherein the waveguide has an axial length L and extends from a closed end at a distance r=R to an open end at a distance r=R+L, both distances being measured from the zero point, whereby an area of the closed end is smaller than an area of the open end and the waveguide tapers from the open end toward the closed end;

wherein the at least one loudspeaker is mounted on the waveguide adjacent to the closed end in such a way that the loudspeaker is acoustically coupled to the interior of the waveguide at the closed end;

wherein L is less than R; and wherein an axial extension of the loudspeaker is less than L.

2. The combination according to claim 1, wherein R is greater than 1.4 feet.

3. The combination according to claim 1, wherein R is greater than 2.0 feet.

4. The combination according to claim 1, wherein R is greater than 2.8 feet.

5. The combination according to claim 1, wherein R is greater than 4.0 feet.

6. The combination according to claim 1, wherein R is greater than 5.6 feet.

7. The combination according to claim 1, wherein R is greater than 8.0 feet.

8. The combination according to claim 1, wherein R is greater than 11.3 feet.

9. The combination according to claim 1, wherein R is greater than 16.0 feet.

10. The combination according to claim 1, wherein the surface that is perpendicular to the line is substantially rectangular, and the at least one loudspeaker is mounted on and extends across a wider side of the waveguide; the waveguide being substantially thinner than the width of the wider side.

11. The combination according to claim 10, wherein the opening at the open end is less than 1.0 inch across and at least 4.0 inches long.

12. The combination according to claim 1 wherein a portion of the interior of the wave guide is planar.

13. The combination according to claim 1, wherein the walls of the waveguide intersect at the zero point.

14. The combination according to claim 1, wherein the loudspeaker has an axis and the axis is oriented substantially transverse to the axial length of the waveguide.

15. The combination according to claim 1, comprising a substantially-closed or closable cabinet containing the loudspeaker.

16. The combination according to claim 15, wherein the cabinet comprises musical instrument holders, whereby the cabinet constitutes an instrument case.

17. A method of using the combination according to claim 1, comprising:

driving the loudspeaker with electrical signals including a lowest desired frequency component $f_1$ and a highest desired frequency component $f_2$, where $f_1$ and $f_2$ correspond respectively to sound wavelengths $\lambda_1$ and $\lambda_2$ to be emitted from the combination; where where R is equal to or greater than $\lambda_1/2\pi$ and the axial extension of the loudspeaker is less than or equal to $\lambda_2/2\pi$.

18. The combination according to claim 12, wherein the interior sides of the waveguide are planar.

* * * * *